US008742573B2

(12) United States Patent
Chen et al.

(10) Patent No.: US 8,742,573 B2
(45) Date of Patent: Jun. 3, 2014

(54) PACKAGE STRUCTURE AND MANUFACTURING METHOD THEREOF (71) Applicants: Universal Scientific Industrial (Shanghai) Co., Ltd., Shanghai (CN); Universal Global Scientific Industrial Co., Ltd., Nantou County (TW)

(72) Inventors: Jenchun Chen, New Taipei (TW); Hsin Chin Chang, Taipei (TW)

(73) Assignees: Universal Scientific Industrial (Shanghai) Co., Ltd., Shanghai (CN); Universal Global Scientific Industrial Co., Ltd., Nantou County (TW)

( * ) Notice: Subject to any disclaimer, the term of this patent is extended or adjusted under 35 U.S.C. 154(b) by 0 days.

(21) Appl. No.: 13/744,033

(22) Filed: Jan. 17, 2013

(65) Prior Publication Data

US 2014/0084483 A1 Mar. 27, 2014

(30) Foreign Application Priority Data

Sep. 24, 2012 (TW) ............... 101134912 A (51) Int. Cl.
*H01L 23/34* (2006.01)
(52) U.S. Cl.
USPC ........................... 257/724; 257/774; 257/700

(58) Field of Classification Search
CPC ............... H01L 21/70; H01L 21/77; H01L 2224/32225; H01L 2224/49175; H01L 2225/06582; H01L 23/3107; H01L 23/3114; H01L 23/31
USPC ........... 438/106; 257/774, 684, 687, 701, 724
See application file for complete search history.

(56) References Cited

U.S. PATENT DOCUMENTS 8,415,203 B2 * 4/2013 Burch et al. .................. 438/110
2004/0082100 A1 * 4/2004 Tsukahara et al. ............ 438/106

* cited by examiner

*Primary Examiner* — A. Sefer
*Assistant Examiner* — Vincent Wall
(74) *Attorney, Agent, or Firm* — Li&Cai Intellectual Property (USA) Office (57) ABSTRACT A package structure comprises a substrate, a plurality of first electronic components, at least a second electronic component, a first covering layer and a wiring layer. A surface of the substrate includes a first region and a second region. The first electronic components are disposed in the first region, wherein at least one of the first electronic components has a first conductive contact. The second electronic component is disposed in the second region. The first covering layer includes a recess and a first exposing region for exposing the first conductive contact. The wiring layer is formed on the recess and electronically coupled to the first conductive contact.

10 Claims, 9 Drawing Sheets

PACKAGE STRUCTURE AND MANUFACTURING METHOD THEREOF

BACKGROUND OF THE INVENTION

1. Field of the Invention

The present invention relates to a package structure and manufacturing method thereof; in particular, to a package structure and manufacturing method thereof about enhancing packaging spatial utilization.

2. Description of Related Art

At present, the electronic products have been common in fields of entertainment, communication, power conversion, internet, computers, and consumer products. The electronic products can also be found in military applications, aviation, automobiles, industrial controllers, and office equipments. The electronic products are emphasized on short, thin, and light, so that the density of distribution of electronic components and circuit is too high. Besides, there is an increase in demand for improving the system processing speed and reducing the sizes of the electronic components. The objective of fabricating electronic products is not only maintaining high efficiency and quality of stabilization but also enhancing spatial utilization.

The efficiency of the system is related to the structure of the system. At present, although Through Silicon Via (TSV) in wafer manufacturing process is emphasized on economizing space and wiring length by stacking die, the reducible wiring length is limited and at most is on the order of millimeter. When the development of electronic products tends to miniaturization, the objective of designing electronic products is to have a smaller and thinner packing structure.

SUMMARY OF THE INVENTION

The exemplary embodiment of the present invention provides a package structure and manufacturing method thereof. Taking advantage of the difference of the height among the electronic components on the substrate; forming the first covering layer including the recess; moving upward the wiring layer onto the electronic components on the loading surface of the substrate. Consequently, the package structure is miniaturized and the cost is reduced.

The exemplary embodiment of the present invention provides a package structure comprising a substrate, a plurality of first electronic components, at least one second electronic component, a first covering layer, and a wiring layer. A surface of the substrate includes a first region and a second region. The first electronic components are disposed in the first region of the substrate, and at least one first electronic component has at least one first conductive contact. At least one second electronic component is disposed in the second region of the substrate. The first covering layer covers the first region and the second region. The first covering layer includes a recess and at least one first exposing region. The recess is disposed in the second region and the first exposing region exposes at least one first conductive contact. The wiring layer covers at least partially some of the recess and at least one exposed first conductive contact and is electronically coupled to at least one first conductive contact.

The exemplary embodiment of the present invention provides a method for manufacturing package structure comprising deposing a plurality of electronic components on the substrate, wherein at least one first electronic component among the electronic components has at least one first conductive contact; forming a first covering layer to cover the electronic components, wherein the first covering layer includes a recess deposed on at least one second electronic component among the electronic components; forming at least one first exposing region on the first covering layer to expose at least one first conductive contact; and forming a wiring layer on the first covering layer to cover partial of the recess and at least one exposed first conductive contact, wherein the wiring layer is electronically coupled to at least one conductive contact.

In summary, the exemplary embodiment of the present invention provides a package structure and manufacturing method thereof. A three-dimensional packaging for electronic components can be fabricated in a single package structure through using a wiring layer above the electronic components. So that the wiring layout of the substrate can have more flexible layout design thereby reduce the required area and wiring density, consequently reduces the overall usage area on the loading surface of the substrate and increases the spatial unitization.

In order to further understand the techniques, means and effects of the present disclosure, the following detailed descriptions and appended drawings are hereby referred, such that, through which, the purposes, features and aspects of the present disclosure can be thoroughly and concretely appreciated; however, the appended drawings are merely provided for reference and illustration, without any intention to be used for limiting the present disclosure.

DETAILED DESCRIPTION OF THE PREFERRED EMBODIMENTS

[An Exemplary Embodiment of Package Structure and Manufacturing Method Thereof]

Figure 1A:
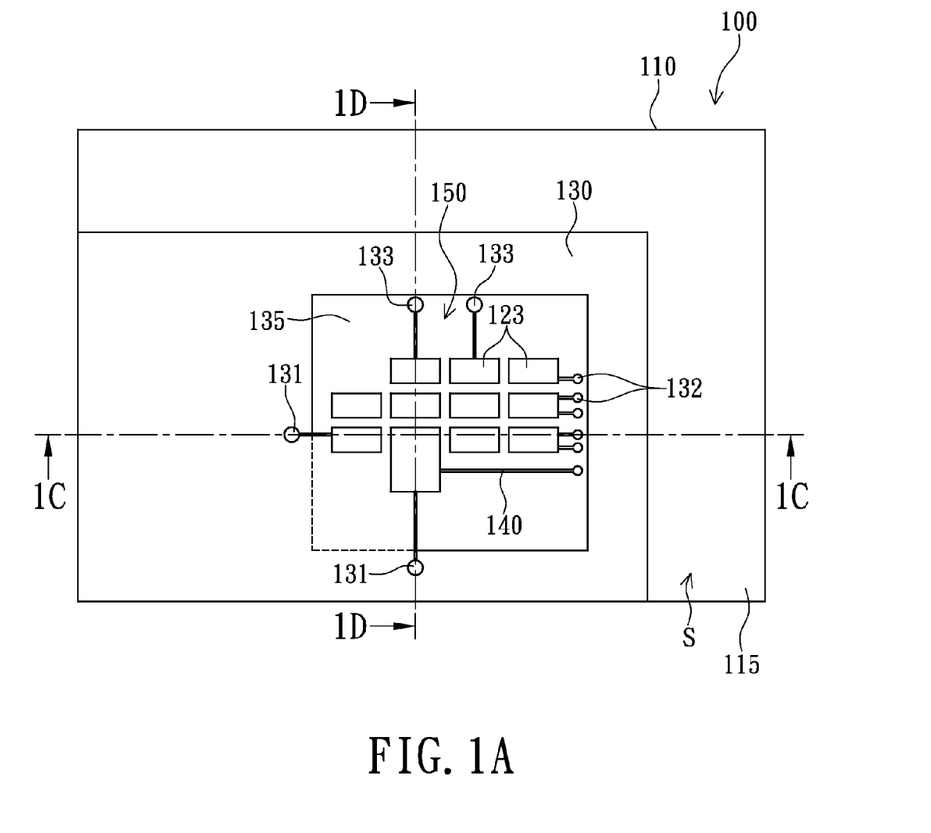
FIG. 1A is a top view illustrating a package structure according to an exemplary embodiment of the present invention.
Figure 1B:
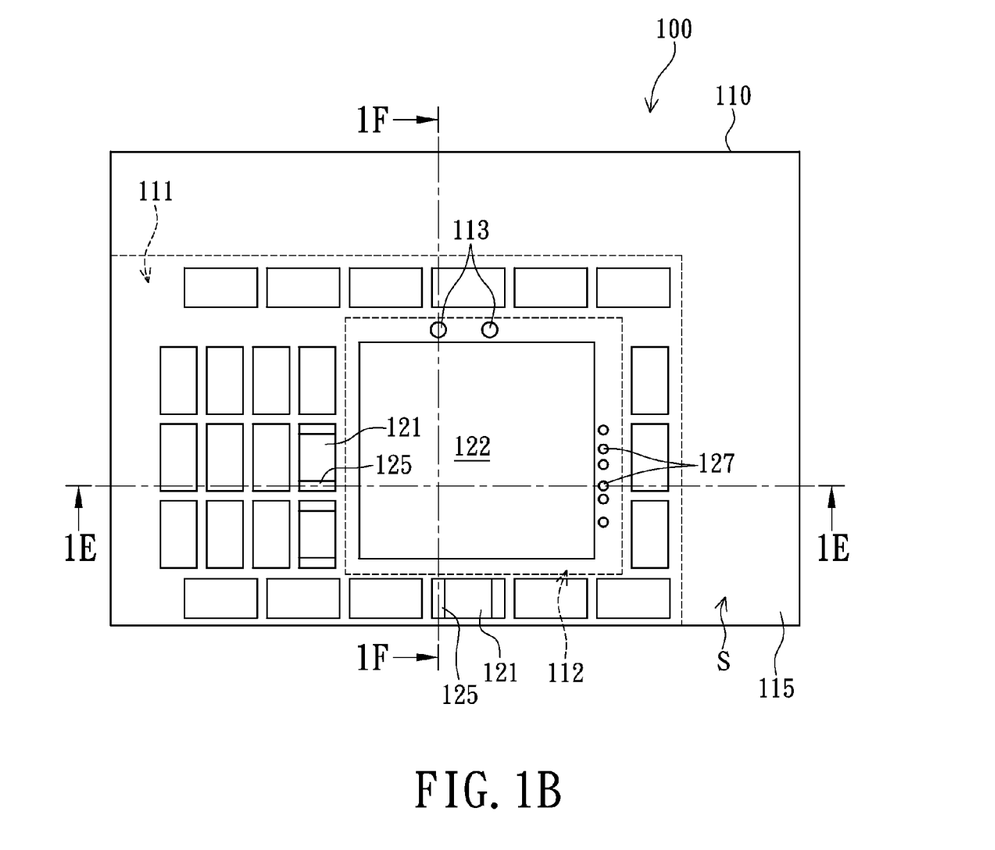
FIG. 1B is a top view illustrating the package structure as shown in FIG. 1A during one exemplary fabrication step.
Figure 1C:
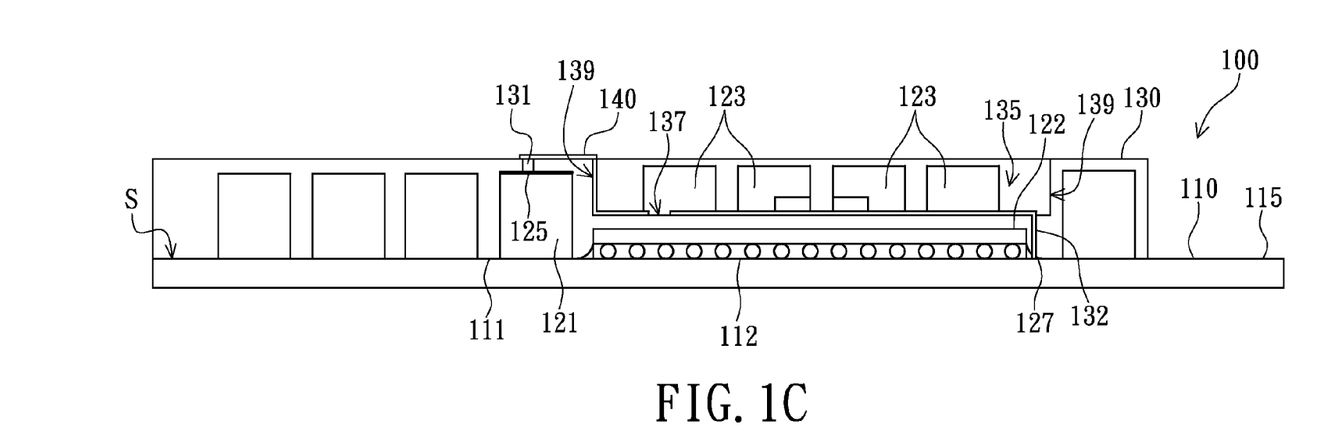
FIG. 1C is a cross-sectional view illustrating the package structure along the line 1C-1C as shown in FIG. 1A.
Figure 1D:
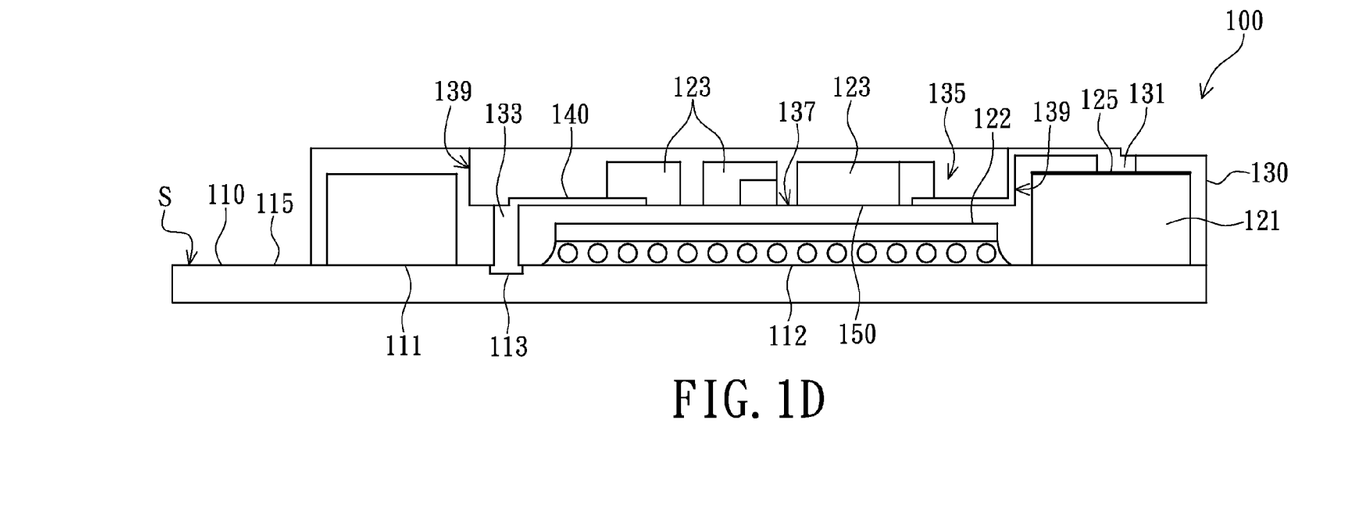
FIG. 1D is a cross-sectional view illustrating the package structure along the line 1D-1D as shown in FIG. 1A.
Figure 1E:
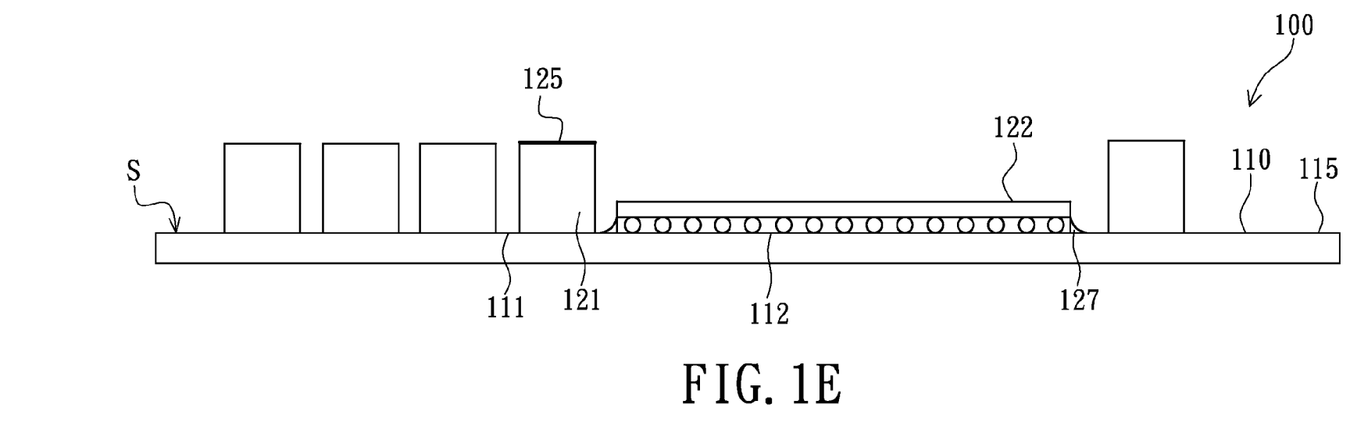
FIG. 1E is a cross-sectional view illustrating the package structure along the line 1E-1E as shown in FIG. 1B.
Figure 1F:
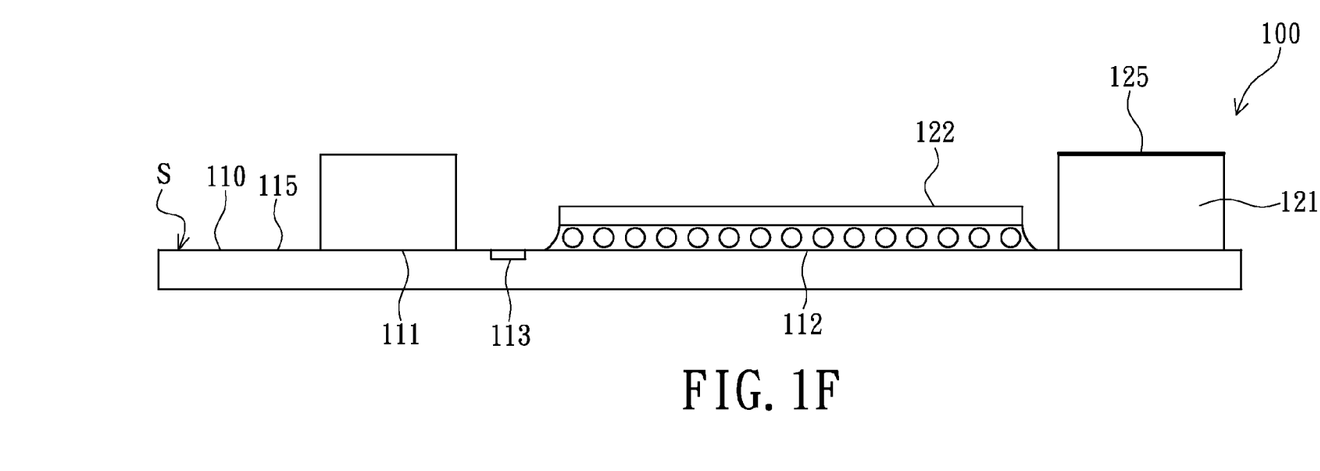
FIG. 1F is a cross-sectional view illustrating the package structure along the line 1F-1F as shown in FIG. 1B.

Please refer to FIG. 1A in conjunction with FIG. 1C, and FIG. 1D. FIG. 1A is a top view illustrating a package structure according to an exemplary embodiment of the present invention. FIG. 1C is a cross-sectional view illustrating the package structure along the line 1C-1C as shown in FIG. 1A. FIG. 1D is a cross-sectional view illustrating the package structure along the line 1D-1D as shown in FIG. 1A. The package structure 100 comprises a substrate 110, a plurality of electronic components (including a first electronic component 121 and a second electronic component 122 as shown in FIG. 1C and FIG. 1D), a first covering layer 130 and a wiring layer 140. Please refer concurrently to FIG. 1B, FIG. 1E, and FIG. 1F, where FIG. 1B is a top view illustrating the package structure as shown in FIG. 1A during one exemplary fabrication step. FIG. 1E is a cross-sectional view illustrating the package structure along the line 1E-1E as shown in FIG. 1B. FIG. 1F is a cross-sectional view illustrating the package structure along the line 1F-1F as shown in FIG. 1B. As shown in FIG. 1B, the substrate 110 may be any carrier that supports electronic components (including the first electronic component 121 and the second electronic component 122) and provides the electronic components electronically coupled to each other, e.g. Printed Wiring Board (PWB) or flex-rigid wiring board. The substrate 110 comprises at least a pad 113 and a top wiring layer (not shown in the figure). The pad 113 is composed of conductive materials and is electronically coupled to a conductive wiring layer (not shown in the figure) or other surfaces (not shown in the figure). In the exemplary embodiment of the instant disclosure, at least one pad is a ground pad electronically coupled to ground (not shown in the figure), wherein the pad 113 and the wiring layer (not shown in the figure) are located on the substrate 110 or buried in the substrate 110. The surface S of the substrate 110 comprises a planar loading surface 115 comprising a first region 111 and a second region 112.

Please refer again to FIG. 1B, FIG. 1E, and FIG. 1F. Firstly, disposing a plurality of electronic components (including the first electronic component 121 and the second electronic component 122) on the substrate 110. In the exemplary embodiment of the instant disclosure, a plurality of first electronic components 121, e.g. the passive elements in standard 0402 packaging, are disposed in the first region 111, and at least one first electronic component 121 has a first conductive contact 125. The first conductive contact 125 is composed of conductive materials and used for electronically coupling. In the exemplary embodiment of the instant disclosure, the first conductive contact 125 is the part terminal of the first electronic component 121. The quantity of the first conductive contact 125 is designed based on practical demands, and the present invention is not limited thereto.

There is at least a second electronic component 122, e.g. the controlling chip, disposing in the second region 112. At least one second electronic component 122 has at least one second conductive contact 127. As shown in FIG. 1B, the quantity of the second electronic component 122 may be one, and the present invention is not limited thereto. The quantity of the second electronic component 122 in the second region 112 may be one or several. At least one second conductive contact 127 is also composed of conductive materials and used for electronically coupling. The structure of the second contact 127 may be, for example, the metal pad on the substrate, the tin sphere or the colloidal silver. The structure and quantity of the second conductive contact 127 is designed based on practical demands, and the present invention is not limited thereto. In other exemplary embodiments, the quantity of the second contact 127 may be only one. It is worth mentioning that types and standards of the electronic components 121, 122 are designed based on practical demands, and the present invention is not limited thereto.

Next, please refer to FIG. 1A, FIG. 1C, and FIG. 1D. Forming the first covering layer 130 to cover the electronic components 121, 122, wherein the first covering layer 130 comprises a recess 135 which is located above at least one second electronic component 122. As shown in FIG. 1C and FIG. 1D, the first covering layer 130 is an insulating layer produced by a sealing process in the first region 111 and the second region 112 with molding material to cover the electronic components 121, 122 and the substrate 110. The sealing process may be, for example, an over-molding process, and materials of the first covering layer 130 may be epoxy resin or silicone. Specifically, the vertical height from at least one second electronic component 122 disposed in the second region 112 to the loading surface 115 is lower than the vertical height from the first electronic component 121 disposed in the first region 111 to the loading surface 115, and the first covering layer 130 is formed by filling the molding material conformingly covering the electronic components 121, 122 disposed in the first region 111 and the second region 112. Thereby, the first covering layer 130 is formed with the recess 135, wherein the recess 135 is disposed above the second region 112.

As shown in FIG. 1C and FIG. 1D, in the exemplary embodiment of the instant disclosure, the recess 135 comprises a bottom surface 137 substantially parallel to the loading surface 115 and four side walls 139 substantially perpendicular to the bottom surface 137. The area of the bottom surface 137 is not less than the vertical projection area of at least one second electronic component 122 on the load surface 115. Additionally, in other exemplary embodiments, the first covering layer 130 comprising the recess 135 may be formed by using molding module in transfer molding or the pressure injection process, or using end mill in the cutting process to remove partial of the first covering layer 130 to form the recess 135, and the present invent is not limited thereto.

As shown in FIG. 1A in conjunction with FIG. 1C, at least a first exposing region 131 is formed on the first covering layer 130 corresponding to the position of at least one first conductive contact 125 to expose at least one first conductive contact 125, and at least a second exposing region 132 is formed on the first covering layer 130 corresponding to the position of at least one second conductive contact 127 to expose at least one second conductive contact 127. In the exemplary embodiment of the instant disclosure, the first exposing region 131 and the second exposing region 132 both are via holes and may be formed in laser drilling process. In detail, using the laser drill bit (not shown in the figure) to drill and cut onto the position of the first conductive contact 125 and the second conductive contact 127 respectively on the first covering layer 130 to remove partial of the first covering layer 130. Whereby the first exposing region 131 and the second exposing region 132 are formed with the internal diameter such as, for example, 5~300 micrometers.

Whereby at least one first exposing region 131 formed on the first covering layer 130 would expose at least one first conductive contact 125, and at least one second exposing region 132 formed on the first covering layer 130 would expose at least one second conductive contact 127. Besides, there are other means for removing the first covering layer 130, for example, plasma etching, chemical etching or mechanical drilling, to form at least one first exposing region 131 and at least one second exposing region 132 which expose at least one first conductive contact 125 and at least one second conductive contact 127, respectively. It is worth mentioning that the area, shape, and quantity of the first exposing region 131 and the second exposing region 132 is designed based on practical demands, and the present invention is not limited thereto.

For example, in other exemplary embodiments, at least one first exposing region 131 may be an opening. Further, the structure of at least one first conductive contact 125 may be welding end of parts and colloidal silver or solder placed on welding end of parts, and the top surface of at least one conductive contact 125 may be aligned with the surface of the first covering layer 130. Furthermore, when the molding material is used for the sealing process into the first region 111 and the second region 112 (as shown in FIG. 1C), the molding module may be applied in order to not cover the surface of at least one conductive contact 125 with the molding material. Thereby the first covering layer 130 comprising at least one exposing region 131 would be formed directly after finishing the sealing process. In other words, the first exposing region 131 on the first covering layer 130 could be formed without end mill cutting or drilling process.

Additionally, as shown in FIG. 1A in conjunction with FIG. 1D, the first covering layer 130 of the package structure 100 further comprises at least one third exposing region 133, and at least one exposing region 133 exposes at least one pad 113 on the substrate 110. Specifically, forming at least one third exposing region 133 corresponding to the position of at least one pad 113 on the first covering layer 130 to expose at least one pad 113 on the substrate 110. In the exemplary embodiment of the instant disclosure, the third exposing region 133 may be via hole, and the area, shape, and quantity of the third exposing region 133 are not limited, too. The minimum internal diameter of the third exposing region maybe 5~0200 micrometers, for example. The means about forming the third exposing region 133 is similar to forming the first exposing region 131, thus the redundant information is not repeated.

Please refer again to FIG. 1A in conjunction with FIG. 1C and FIG. 1D. Then, forming the wiring layer 140 on the first covering layer 130 to cover partial of the recess 135, at least one exposed first conductive contact 125, at least one exposed second conductive contact 127, and at least one exposed pad 113 and is electronically coupled to at least one first conductive contact 125, at least one second conductive contact 127, and at least one pad 113 to accomplish the package structure 100. In the exemplary embodiment of the instant disclosure, the conductive material could be deposited to conformingly cover the recess 135, at least one first exposing layer 131, at least one second exposing layer 132, and at least one third exposing layer 133. Specifically, the conductive material conformingly covers the bottom surface 137 and the side wall 139 of the recess 135. Besides, the conductive material also conformingly covers or fills the internal side wall of at least one first exposing region 131 and at least one first conductive contact 125 for electronically coupling to at least one first conductive contact 125.

Similarly, the conductive material conformingly covers or fills the internal side wall of at least one second exposing region 132 and at least one second conductive contact 127. The conductive material also conformingly covers the internal side wall of at least one third exposing region 133 and at least one pad 113 for electronically coupling to at least one second conductive contact 127 and at least one pad 113. Then, partial of the deposited conductive material are patterned by the means of laser ablation and the wring layer 140 is therefore formed, in which the patterned means is not limited thereto. Whereby the wiring layer 140 may be electronically coupled to at least one first conductive contact 125 through at least one first exposing region 131, electronically coupled to at least one second conductive contact 127 through at least one second exposing region 132, and electronically coupled to at least one pad 113 through at least one third exposing region 133.

In the exemplary embodiment of the instant disclosure, the means for depositing the conductive material may be, for example, spray coating, electroplating, electrolessplating, deposition, and sputtering, etc. The preferred thickness of the wiring layer 140 is between 20 micrometers and 100 micrometers. The wiring layer 140 may be a plurality of deposited conductive materials which are composed of, metallic material, alloy material, conductive macromolecular material, or combination of above conductive materials. Besides, the pattern of the wiring layer 140 is designed according to practical condition by those skilled in the art, and the exemplary of the instant disclosure is not limited thereto. In other exemplary embodiments, the means for forming the wiring layer 140 may be using a patterned mask, i.e. setting the mask on the first covering layer 130 and then performing the depositing process with conductive material.

In the exemplary embodiment of the instant disclosure, the package structure 100 can further comprise a third region 150 (as shown in FIG. 1A) which is disposed in the recess 135. The third region 150 comprises at least one third electronic component 123. When the third electronic component 123 is disposed on the bottom surface 137 of the recess 135, the third electronic component 123 can be electronically coupled to at least one first conductive contact 125, at least one second conductive contact 127 and at least one pad 113 through the wiring layer 140. Whereby the third electronic component 123 is electronically coupled to at least one first electronic component 121, at least one second electronic component 122, and at least one pad 113. As shown in FIG. 1A, the third region 150 is disposed in the bottom surface 137 of the recess 135. It is worth mentioning that the area and shape of the third region 150 is designed based on practical demands, and the present invention is not limited thereto. In other exemplary embodiments, the third region 150 may be disposed in partial of the bottom surface 137 of the recess 135 and/or partial of the side wall 139 of the recess 135.

In detail, as shown in FIG. 1C and FIG. 1D, the wiring layer 140 conformingly covers the bottom surface 137 and the side wall 139 of the recess 135 and is electronically coupled to at least one first conductive contact 125 through at least one first exposing region 131, is electronically coupled to at least one second conductive contact 127 through at least one second exposing region 132, and is electronically coupled to at least one pad 113 through at least one third exposing region 133. Thereby, at least one third electronic component 123 disposed on the recess 135 is electronically coupled to at least one first conductive contact 125, at least second conductive contact 127, and at least one pad 113 through the wiring layer 140.

In the exemplary embodiment of the instant disclosure, it is worth mentioning that the third electronic component 123 is, for example, the passive element in standard 0201 packaging, and the types and standards of the third electronic component 123 is designed based on practical demands. Besides, the quantity and means for deposing the third electronic component 123 are designed based on practical demands and conformation with the wiring layer 140, and the present invention is not limited thereto.

[An Another Exemplary Embodiment of Package Structure and Manufacturing Method Thereof]

Figure 2A:
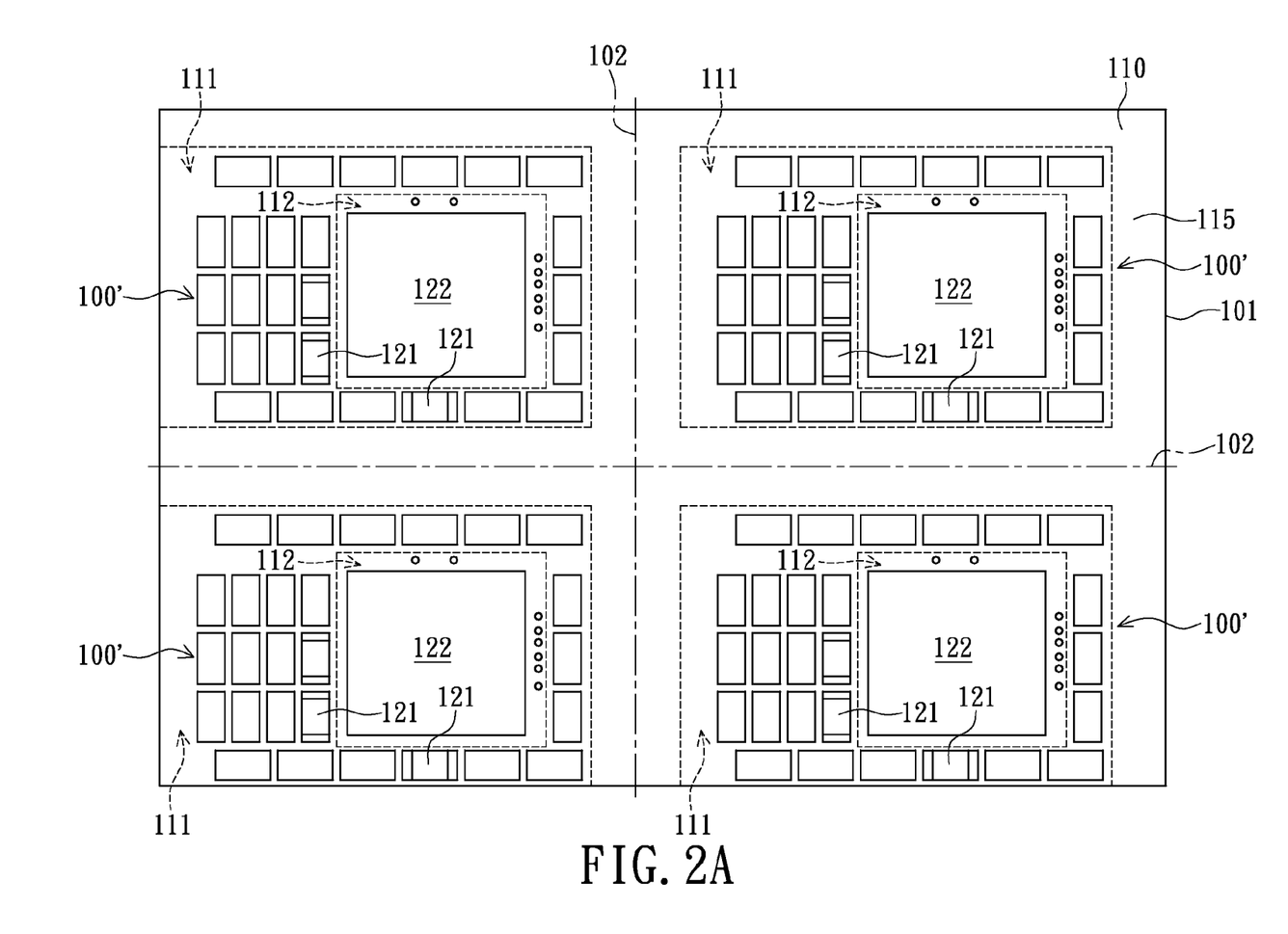
FIG. 2A is a top view illustrating the package structure during one exemplary fabrication step according to another exemplary embodiment of the present invention.
Figure 2B:
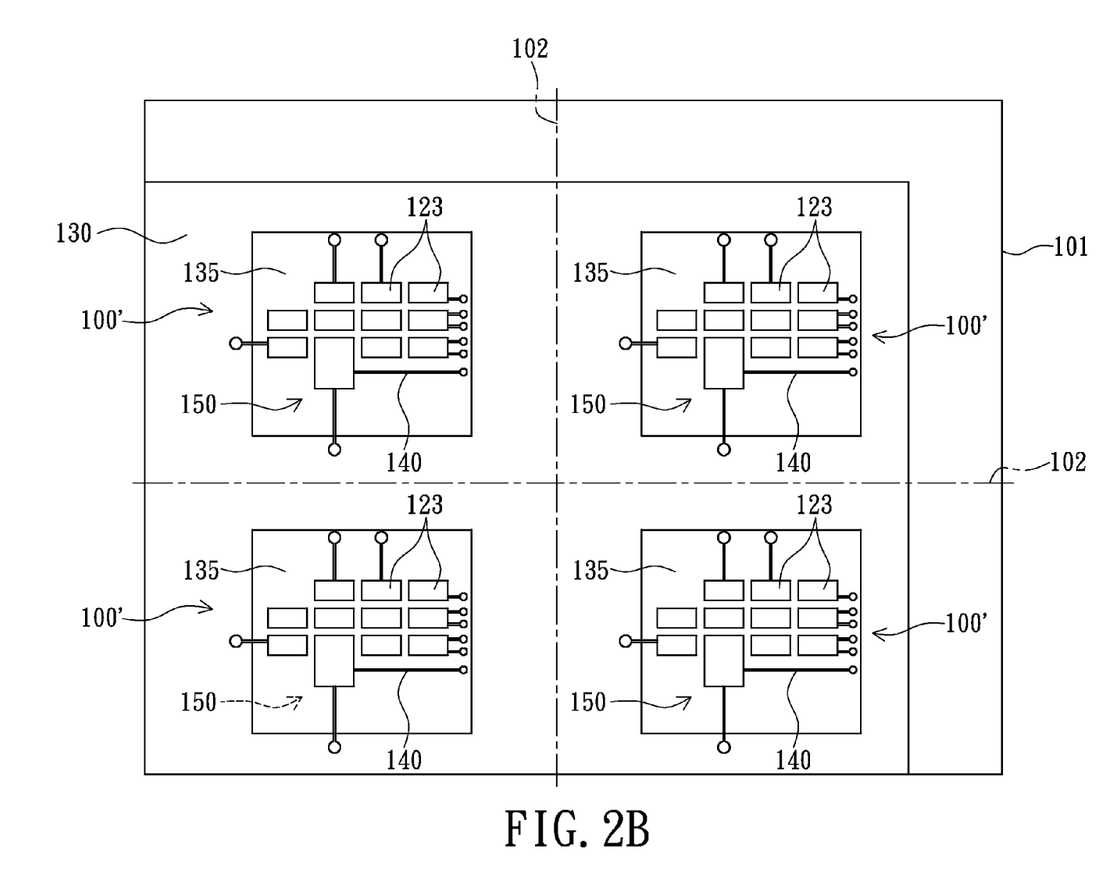
FIG. 2B is a top view illustrating the package structure during one exemplary fabrication step according to another exemplary embodiment of the present invention.

Please refer to FIG. 2A and FIG. 2B, FIG. 2A and FIG. 2B are top views illustrating the package structure during one exemplary fabrication step according to another exemplary embodiment of the present invention. The package structure 100' and manufacturing method thereof in the present exemplary embodiment is similar to the package structure 100 (as shown in FIG. 1A) and manufacturing thereof in the aforementioned exemplary embodiment. The descriptions below are difference between the present exemplary embodiment and the aforementioned exemplary embodiment.

As shown in FIG. 2A, firstly, providing the initial substrate 101. The initial substrate 101 comprises a plurality of substrates 110 which are defined by a plurality of cutting lines 102 on the initial substrate 101. Similarly, the loading surface 115 of each substrate 110 comprises a first region 111 and a second region 112. Thereby a plurality of electronic components (including the first electronic component 121 and the second electronic component 122) could be disposed on each substrate 110.

Then, as shown in FIG. 2B, forming the first covering layer 130 to cover the electronic components 121, 122 (FIG. 2A), and forming a plurality of recess 135 on the first covering layer 130. Each recess 135 is disposed above at least one of the second electronic component 122 of each substrate 110 (FIG. 2A). In the exemplary embodiment of the instant disclosure, the sealing process is performed with molding material on a plurality of substrates 110 to conformingly cover the electronic components 121, 122 and each substrate 110 (FIG. 2A). The remaining details of the manufacturing process in FIG. 2A to FIG. 2B are similar to those shown in FIG. 1A to FIG. 1F, those skilled in the art should be able to deduce the other embodiments according to the disclosure of the present invention, and further descriptions are therefore omitted.

Finally, cutting the substrate 110 along the cutting line 102 to accomplish a plurality of package structures 100'. Specifically, by performing the blade sawing process or the laser sawing process to separate the substrate 110 and the first covering layer 130 which covers the loading surface 115 of the substrate 110 to accomplish a plurality of package structures 110'.

[An Another Exemplary Embodiment of Package Structure and Manufacturing Method Thereof]

Figure 3:
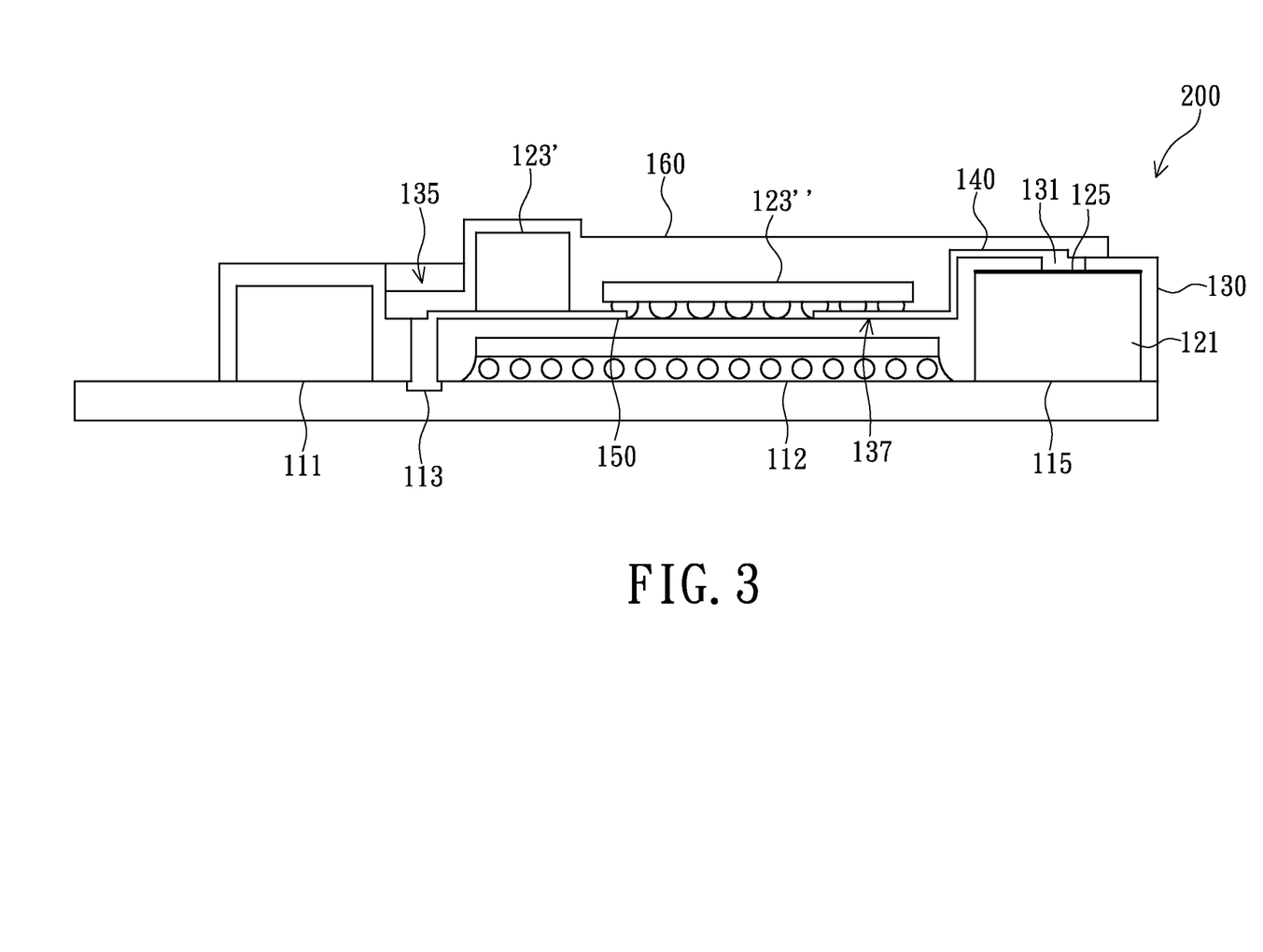
FIG. 3 is a cross-sectional view illustrating the package structure according to another exemplary embodiment of the present invention.

Please refer to FIG. 3 showing a cross-sectional view illustrating the package structure according to another exemplary embodiment of the present invention. The package structure 200 and manufacturing method thereof in the present exemplary embodiment is similar to the package structure 100 (as shown in FIG. 1A) and manufacturing thereof in the aforementioned exemplary embodiment. The descriptions below illustrate the difference between the present exemplary embodiment and the aforementioned exemplary embodiment.

In the exemplary embodiment of the instant disclosure, the package structure 200 further comprises a third region 150 which is disposed in the recess 135. As shown in FIG. 3, in detail, deposing at least one third electronic component 123' or 123" on the bottom surface 137 of the recess 135. Whereby the third electronic component 123' or 123" is electronically coupled to at least one first conductive contact 125 through the wiring layer 140 or further electronically coupled to at least one second conductive contact 127 (not shown in the figure) based on practical demands. The third electronic component 123' may be the passive element in standard 0402 packaging or smaller standard, and the third electronic component 123" may be the controlling chip. Thereby the vertical height from the third electronic component 123' disposed in the third region 150 to the loading surface 115 is higher than the vertical height from the first electronic component 121 disposed in the first region 111 to the loading surface 115, and the vertical height from the third electronic component 123" disposed in the third region 150 to the loading surface 115 is lower than the vertical height from the first electronic component 121 disposed in the first region 111 to the loading surface 115. The standards and shapes of the third electronic components 123' and 123" are designed based on practical demands, and the present invention is not limited thereto.

The package structure 200 further comprises a second covering layer 160 to cover the third region 150 and the third electronic component 123', 123" onto. As shown in FIG. 3, specifically, forming a second covering layer 160 to cover the third electronic components 123' and 123", the exposed wiring layer 140, and at least one first exposing region 131. Furthermore, the second covering layer 160 also covers the exposed wiring layer 140 and at least one second exposing region 132 (not shown in the figure), even covers the exposed wiring layer 140 and at least one third exposing region 133 (not shown in the figure) based on practical demands.

The second covering layer 160 is the insulating layer formed by performing a sealing process in the third region 150 with molding material to cover the third electronic components 123', 123", at least partial of the recess 135, and even partial of the exposed wiring layer 140. In the exemplary embodiment of the instant disclosure, the second covering layer 160 conformingly covers the third electronic components 123', 123", at least partial of the recess 135, and may further cover partial of the exposed wiring layer 140. The remaining details of the manufacturing process in FIG. 3 are similar to the process shown from FIG. 1A to FIG. 1F, those skilled in the art should be able to deduce the other embodiments according to the disclosure of the present invention, and further descriptions are therefore omitted.

[An Another Exemplary Embodiment of Package Structure and Manufacturing Method Thereof]

Figure 4:
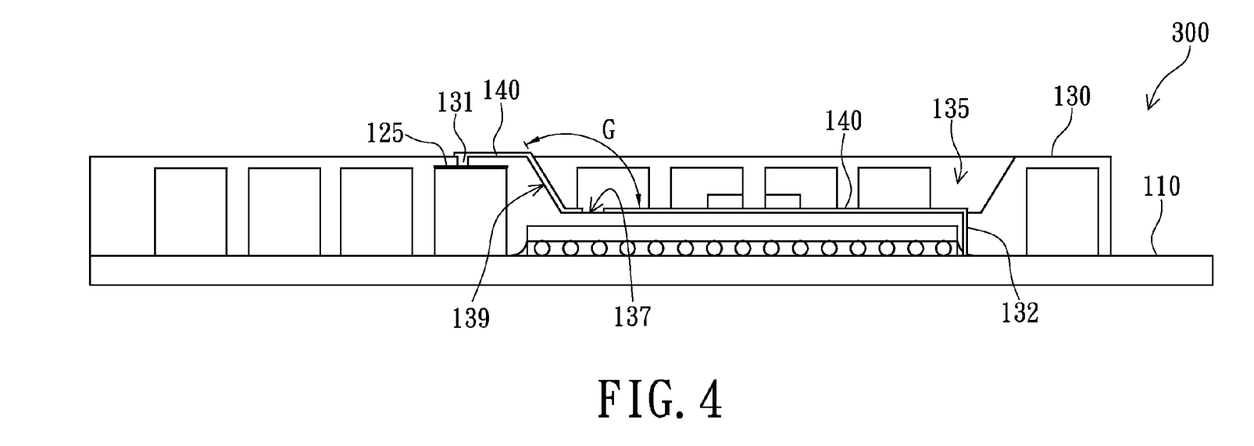
FIG. 4 is a cross-sectional view illustrating the package structure according to another exemplary embodiment of the present invention.

Please refer to FIG. 4 showing a cross-sectional view illustrating the package structure according to another exemplary embodiment of the present invention. The package structure 300 and manufacturing method thereof in the present exemplary embodiment is similar to the package structure 100 (as shown in FIG. 1A) and manufacturing thereof in the aforementioned exemplary embodiment. The descriptions below are difference between the present exemplary embodiment and the aforementioned exemplary embodiment. As shown in FIG. 4, in the exemplary embodiment of the instant disclosure, the side wall 139 and the bottom surface 137 of the recess 135 intersect to form an angle G, the preferred angle G is between 90 degree and 135 degree. When the wiring layer 140 is formed on the first covering layer 130, the conductive material conformingly covers the side wall 139 and the bottom surface 137 of the recess 135, and the angle G is designed based on practical demands for enhancing the yield rate and flexibility of the depositing conductive material process, and the present invention is not limited thereto. The remaining details of the manufacturing process in FIG. 4 are similar to the process shown from FIG. 1A to FIG. 1F, those skilled in the art should be able to deduce the other embodiments according to the disclosure of the present invention, and further descriptions are therefore omitted.

[An Another Exemplary Embodiment of Package Structure and Manufacturing Method Thereof]

Figure 5:
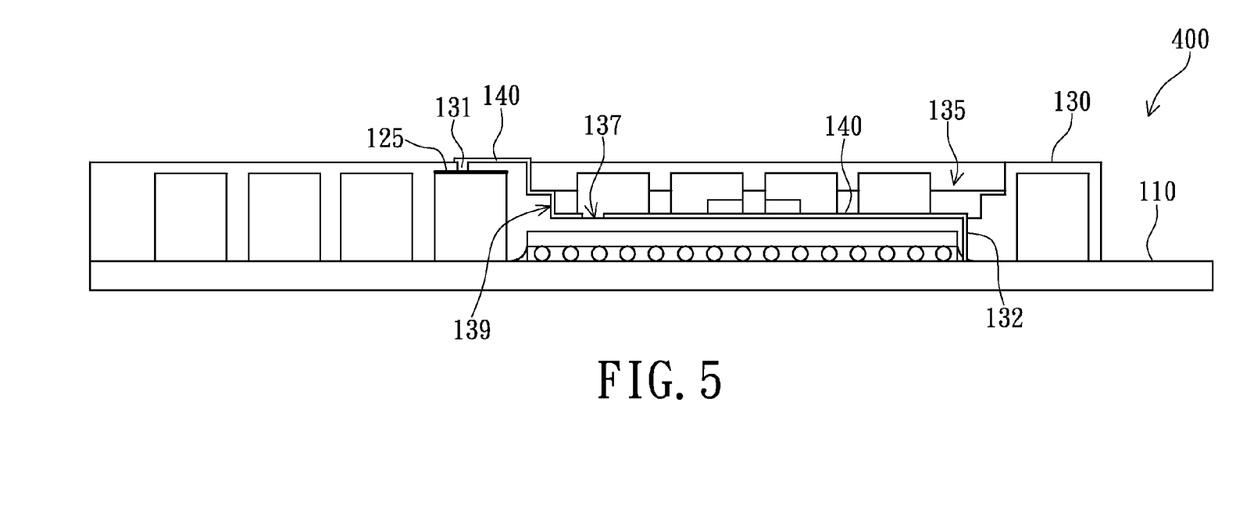
FIG. 5 is a cross-sectional view illustrating the package structure according to another exemplary embodiment of the present invention.

Please refer to FIG. 5 showing a cross-sectional view illustrating the package structure according to another exemplary embodiment of the present invention. The package structure 400 and manufacturing method thereof in the present exemplary embodiment is similar to the package structure 100 (as shown in FIG. 1A) and manufacturing thereof in the aforementioned exemplary embodiment. The descriptions below are difference between the present exemplary embodiment and the aforementioned exemplary embodiment. As shown in FIG. 5, in the exemplary embodiment of the instant disclosure, the side wall 139 of the recess 135 is ladder shaped. When the wiring layer 140 is formed on the first covering layer 130, the conductive material conformingly covers the side wall 139 and the bottom surface 137 of the recess 135, and the shape of the side 139 is designed based on practical demands for enhancing the yield rate and flexibility of the depositing conductive material process, and the present invention is not limited thereto. The remaining details of the manufacturing process in FIG. 5 are similar to those shown in FIG. 1A to FIG. 1F, those skilled in the art should be able to deduce the other embodiments according to the disclosure of the present invention, and further descriptions are therefore omitted.

[An Exemplary Embodiment of Method for Manufacturing Package Structure]

Figure 6:
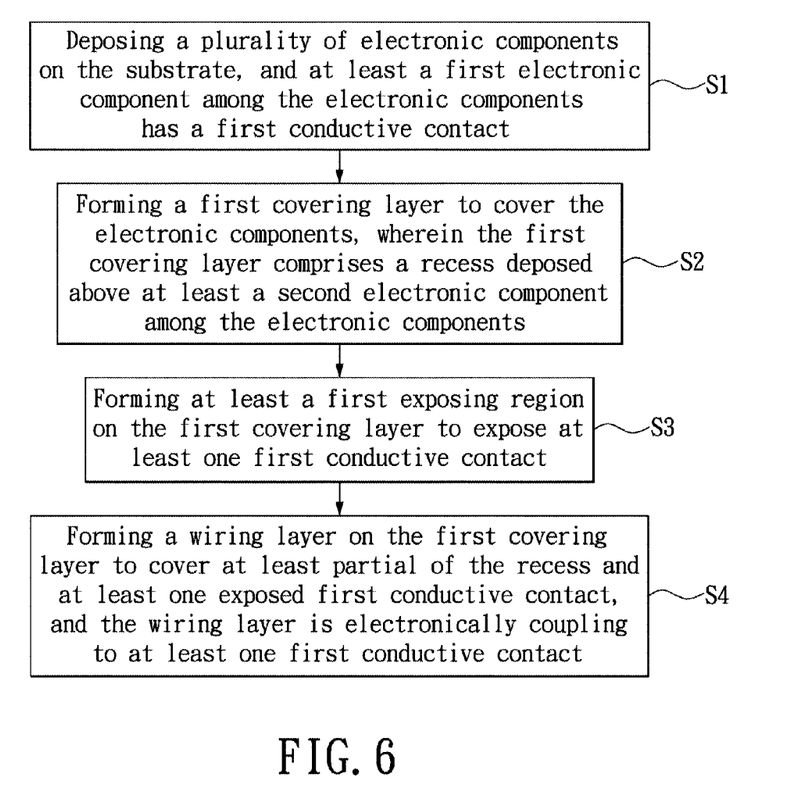
FIG. 6 is a flowchart illustrating a method for manufacturing package structure according to another exemplary embodiment of the present invention.

The method for manufacturing the package structure can be generalized from above exemplary embodiments, please refer to the flowchart in FIG. 6. Firstly, deposing a plurality of electronic components on the substrate, and at least a first electronic component among the electronic components has a first conductive contact (step S1); forming a first covering layer to cover the electronic components, wherein the first covering layer comprises a recess deposed above at least a second electronic component among the electronic components (step S2); forming at least a first exposing region on the first covering layer to expose at least one first conductive contact (step S3); and forming a wiring layer on the first covering layer to cover at least partial of the recess and at least one exposed first conductive contact, and the wiring layer is electronically coupling to at least one first conductive contact (step S4).

According to different products, the above process may further comprise that forming at least a second exposing region on the first covering layer to expose at least one second conductive contact on the substrate. The wiring layer covers at least one exposed second conductive contact and is electronically coupled to at least one second conductive contact. Furthermore, the above flowchart may further comprise that forming at least a third exposing region on the first covering layer to expose at least one pad on the substrate. The wiring layer covers at least one exposed pad and is electronically coupled to at least one pad.

Besides, after the step of forming the wiring layer, the above process may further comprise that deposing at least one third electronic component on the recess, in which the third electronic component is electronically coupled to at least one first conductive contact and at least one second conductive contact through the wiring layer; then, forming the second covering layer to cover at least one third electronic component, at least partial of the wiring layer, and at least one first exposing region. Furthermore, the second covering layer may also cover the exposed wiring layer and at least one second exposing region, or further cover the exposed wiring layer and at least one third exposing region based on practical demands.

In summary, the exemplary embodiment of the instant disclosure provides a package structure and manufacturing method thereof. Taking advantage of the difference of the height between the electronic components on the substrate to form the first covering layer comprising the recess, and to move upwardly the wiring layer above the electronic components on the loading surface of the substrate. The wiring layer is electronically coupled to the electronic components and the pad through the first exposing region, the second exposing region, and the third exposing region. The effect of the package structure and manufacturing method thereof in above exemplary embodiments is reducing the length of electrical wires which is on the order of millimeter. Thereby the efficiency of the electronic system would be enhanced efficiently.

A three-dimensional packaging for electronic components can be fabricated in a single package structure through using a wiring layer above the electronic components. So that the wiring layout of the substrate can have more flexible layout design thereby reducing the required area and wiring density, consequently reducing the overall usage area on the loading surface of the substrate and increasing the spatial unitization. Moreover, in the exemplary embodiment of the instant disclosure, by taking advantage of the recess above the electronic components to reduce form factors of the package structure, which contributes to the design of miniaturizing products. Thereby flexibility of designing electronic products is enhanced and the manufacturing material and processing costs are reduced.

The descriptions illustrated *supra* set forth simply the preferred embodiments of the present invention; however, the characteristics of the present invention are by no means restricted thereto. All changes, alternations, or modifications conveniently considered by those skilled in the art are deemed to be encompassed within the scope of the present invention delineated by the following claims.

What is claimed is:

1. A package structure, comprising:
    a substrate, a surface of the substrate comprises a first region and a second region;
    at least one first electronic component disposed in the first region of the substrate, at least one first electronic component having at least one first conductive contact;
    at least one second electronic component, disposed in the second region of the substrate;
    a first covering layer, covering the at least one first electronic component in the first region and the at least one second electronic component in the second region, wherein the first covering layer comprises a recess and at least one first exposing region, the recess is disposed above the second region and the at least one first exposing region exposes the at least one first conductive contact, and
    wherein the distance between any point on the top surface of the first covering layer above the second region and the surface of the second region is smaller than the distance between any point on the top surface of the first covering layer above the first region and the surface of the first region; and
    a wiring layer, covering at least partial of the recess and the at least one exposed first conductive contact, and being electronically coupled to the at least one first conductive contact.

2. The package structure according to claim 1, wherein the at least one first exposing region is a via hole, the wiring layer covers the at least one first exposing region and is electronically coupled to the at least one first conductive contact through the at least one first exposing region.

3. The package structure according to claim 1, wherein the at least one first exposing region is via hole, the wiring layer fills conductive material to the at least one first exposing region and is electronically coupled to the at least one first conductive contact through the at least one first exposing region.

4. The package structure according to claim 1, wherein the side wall and the bottom surface of the recess form an angle between the side wall and the bottom surface of the recess, the angle is between 90 degree and 135 degree.

5. The package structure according to claim 1, wherein the side wall of the recess is ladder shaped.

6. The package structure according to claim 1, wherein the second region comprises at least one second conductive contact, the first covering layer further comprises at least one second exposing region which exposes the at least one second conductive contact, and the wiring layer covers the at least one exposed second conductive contact and is electronically coupled to the at least one second conductive contact.

7. The package structure according to claim 6, the first covering layer further comprises at least one third exposing region, the at least one third exposing region exposes at least one pad on the substrate, and the wiring layer covers the at least one pad and is electronically coupled to the at least one pad.

8. The package structure according to claim 6, further comprising:

a third region disposed on the recess, at least one third electronic component is disposed in the third region and is electronically coupled to the at least one first conductive contact through the wiring layer; and a second covering layer, covering the at least one third electronic component.

9. The package structure according to claim 8, wherein the at least one third electronic component is electronically coupled to the at least one second conductive contact through the wiring layer.

10. The package structure according to claim 1, wherein the distance between any point on the top surface of the at least one second electronic component and the surface of the second region is smaller than the distance between any point on the top surface of the at least one first electronic component and the surface of the first region.

* * * * *